(12) United States Patent
Ushikubo

(10) Patent No.: US 10,236,465 B2
(45) Date of Patent: Mar. 19, 2019

(54) ORGANIC ELECTROLUMINESCENCE DISPLAY DEVICE

(71) Applicant: Japan Display Inc., Minato-ku (JP)

(72) Inventor: Takahiro Ushikubo, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/707,171

(22) Filed: Sep. 18, 2017

(65) Prior Publication Data

US 2018/0090706 A1    Mar. 29, 2018

(30) Foreign Application Priority Data

Sep. 23, 2016 (JP) ................. 2016-185574

(51) Int. Cl.
 *H01L 27/32* (2006.01)
 *H01L 51/00* (2006.01)
 (Continued)

(52) U.S. Cl.
 CPC ...... *H01L 51/5056* (2013.01); *H01L 27/3248* (2013.01); *H01L 27/3258* (2013.01); *H01L 27/3262* (2013.01); *H01L 51/0097* (2013.01); *H01L 51/5004* (2013.01); *H01L 51/5012* (2013.01); *H01L 51/5088* (2013.01); *H01L 51/5206* (2013.01); *H01L 51/5234* (2013.01); *H01L 51/5271* (2013.01); *H01L 51/5275* (2013.01); *H01L 51/5253* (2013.01); *H01L 2227/326* (2013.01);
 (Continued)

(58) Field of Classification Search
 None
 See application file for complete search history.

(56) References Cited

U.S. PATENT DOCUMENTS

2006/0097264 A1\* 5/2006 Kim ............... H01L 51/5265
  257/72
2007/0069641 A1\* 3/2007 Hasegawa ............ C09K 11/06
  313/504
(Continued)

FOREIGN PATENT DOCUMENTS

JP   2009-187748   8/2009
JP   2013-051155   3/2013

*Primary Examiner* — Erik Kielin
(74) *Attorney, Agent, or Firm* — Oblon, McClelland, Maier & Neustadt, L.L.P.

(57) ABSTRACT

At the time of removing a flexible organic electroluminescence display device from a support substrate, delamination is prevented from occurring at a laminate structure of an OLED. The organic electroluminescence display device includes a flexible base material, a plurality of organic electroluminescence elements, each comprising a pixel electrode, a reflective layer that is disposed between the base material and the pixel electrode and reflects light, a semi-transparent counter electrode that is disposed on a light-emitting surface side with respect to the pixel electrode, and an organic electroluminescence function layer that is a lamination including an organic light-emitting layer and disposed between the pixel electrode and the counter electrode, a transparent electrode laminated on the counter electrode, an organic film laminated on the transparent electrode 80, and a gap 84 generated at a part of an interface between the transparent electrode 80 and the organic film 82.

6 Claims, 4 Drawing Sheets

(51) Int. Cl.
*H01L 51/50* (2006.01)
*H01L 51/52* (2006.01)

(52) U.S. Cl.
CPC ............... *H01L 2251/5315* (2013.01); *H01L 2251/5338* (2013.01); *H01L 2251/552* (2013.01)

(56) References Cited

U.S. PATENT DOCUMENTS

| 2011/0309349 | A1* | 12/2011 | Matsuura | H01L 51/5218 257/40 |
| 2014/0131674 | A1* | 5/2014 | Park | H01L 27/3209 257/40 |
| 2017/0179441 | A1* | 6/2017 | Lee | H01L 27/3246 |
| 2017/0330923 | A1* | 11/2017 | Chung | H01L 27/124 |

* cited by examiner

ORGANIC ELECTROLUMINESCENCE DISPLAY DEVICE

CROSS-REFERENCE TO RELATED APPLICATION

The present application claims priority from Japanese application JP2016-185574 filed on Sep. 23, 2016, the content of which is hereby incorporated by reference into this application.

BACKGROUND OF THE INVENTION

1. Field of the Invention

The present invention relates to an organic electroluminescence (EL) display device.

2. Description of the Related Art

The organic EL display device has a display panel on which a thin film transistor (TFT) and an organic light-emitting diode (OLED) are formed on a substrate. A glass substrate has been used for a base material of a display panel. Recently work has been progressing on a flexible display that uses, for example, a resin film, such as a polyimide film, for the base material and enables a display panel to be bent.

SUMMARY OF THE INVENTION

The flexible display is formed by forming a laminate structure including a TFT and an OLED on a base material such as a resin film disposed on a support substrate, which is a glass plate and so on, and then separating the laminate structure including the resin film from the support substrate by irradiating the back side of the glass plate with a laser beam, for example. In the process of separating the support substrate, for example, a drawback of current approaches is that delamination occurs on the laminate structure between electrodes of the OLED.

One or more embodiments of the present invention have been conceived in view of the above, and an object thereof is to provide an organic EL display device in which delamination is hard to occur on a laminate structure between electrodes of an OLED.

An organic electroluminescence display device according to the present invention includes a flexible base material, a plurality of organic electroluminescence elements, each comprising a pixel electrode, a reflective layer that is disposed between the base material and the pixel electrode and reflects light, a semitransparent counter electrode that is disposed on a light-emitting surface side with respect to the pixel electrode and opposes to the pixel electrode, and an organic electroluminescence function layer that is a lamination including an organic light-emitting layer and disposed between the pixel electrode and the counter electrode, a transparent electrode laminated on the counter electrode, an organic film laminated on the transparent electrode, and a gap generated at a part of an interface between the transparent electrode and the organic film.

DETAILED DESCRIPTION OF THE INVENTION

An embodiment of the present invention will be described below in detail with reference to the accompanying drawings. In this regard, the present invention is not to be limited to the embodiment described below, and can be changed as appropriate without departing from the spirit of the invention.

The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the detailed description of the invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

The embodiment described below is directed to an organic EL display device that displays an image using an OLED, which is an organic EL element. The organic EL display device is an active matrix display device, and is mounted on televisions, personal computers, mobile terminals, and mobile phones, for example.

The embodiment below describes a display device capable of displaying a color image, in which a plurality of pixels (sub-pixels) having different luminescent colors are arranged in an image display area. A pixel of the color image corresponds to a group of plural types of sub-pixels in the display device. A sub-pixel is a unit in a structure in the display device, and an OLED and a pixel circuit is formed for each sub-pixel. As such, a sub-pixel is basically treated as a pixel in the following description.

Figure 1:
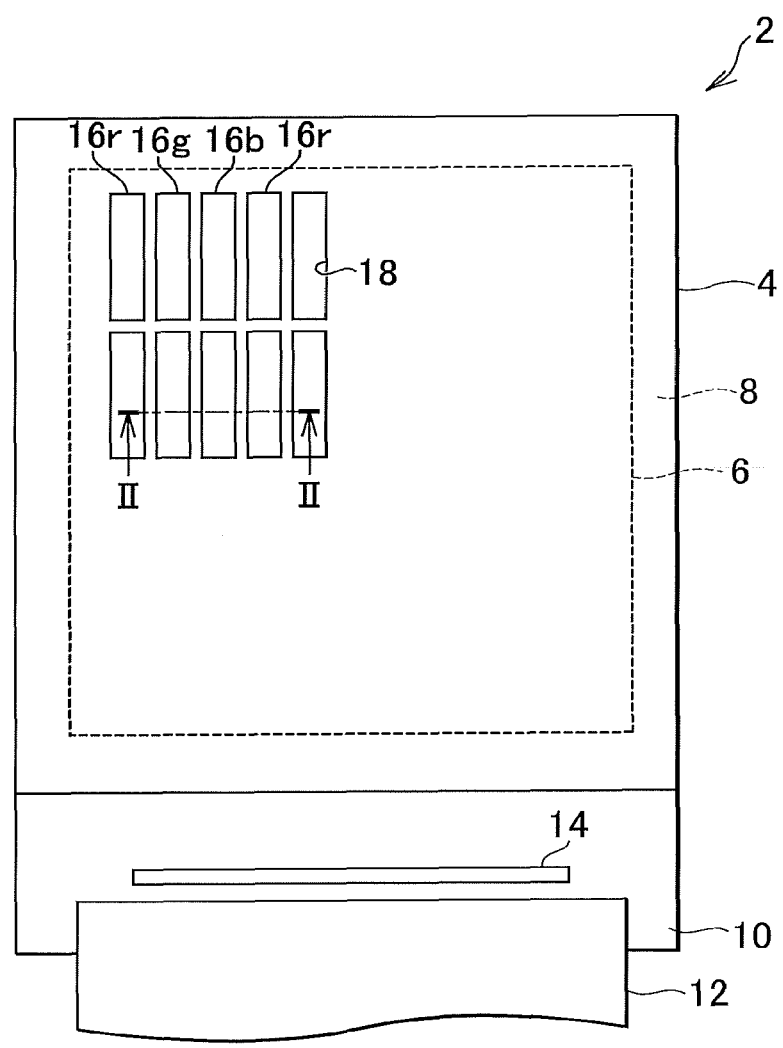
FIG. 1 is a schematic plan view of a display panel of an organic EL display device according to an embodiment of the present invention.

FIG. 1 is a schematic plan view of a display panel 2 of the organic EL display device according to the embodiment. A device substrate 4 of the display panel 2 is rectangular, and includes a display area 6, a frame area 8, and a component mounting area 10.

The pixels are two-dimensionally arranged in the display area 6, and a pixel circuit including an OLED and a TFT is formed for each pixel. The frame area 8 is positioned outside of the display area 6. The component mounting area 10, which is positioned on one side of the rectangular display panel 2, includes wiring connected to the display area 6. Further, the component mounting area 10 is connected to an FPC 12, or includes a drive IC 14 of the display panel 2. The FPC 12 is connected to a drive circuit or a control device of the display panel 2. Electronic components, such as the drive IC 14, may be mounted on the FPC 12.

The pixels 18 of a color image displayed by the display panel 2 includes, for example, pixels (sub-pixels) that emit light of red (R), green (G), and blue (B) colors.

In this embodiment, an example is explained in which R pixels 16r, G pixels 16g, and B pixels 16b are arrayed in stripes in the display area 6. In this array, pixels of the same type (color) are arranged in the vertical direction of the image, and RGB are periodically arranged in the horizontal direction. In FIG. 1, the R pixels 16r, the G pixels 16g, and the B pixels 16b schematically show effective light-emitting areas.

The device substrate 4 is formed to be flexible by using a base material such as a resin film. That is, in the manufacturing process of the device substrate 4, the OLED and the TFT are formed on the base material of a resin film, for example. In the manufacturing process, the device substrate 4 is kept flat by the support substrate.

Figure 2:
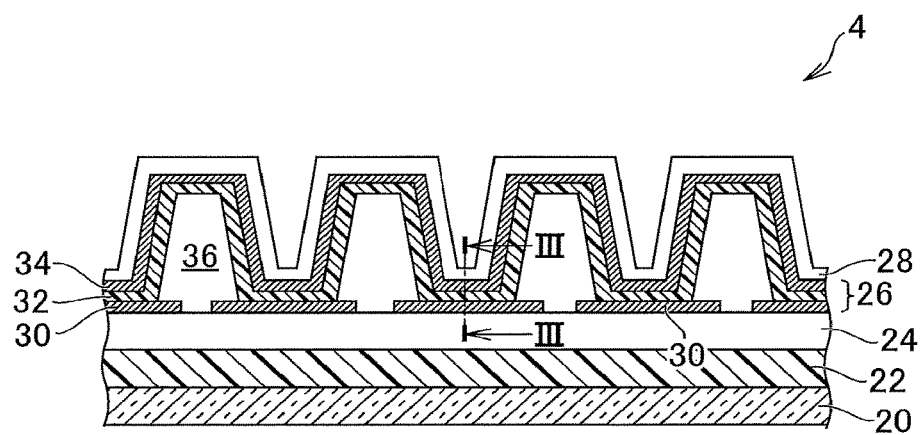
FIG. 2 is a schematic vertical sectional view of a device substrate in a manufacturing process.

FIG. 2 is a schematic vertical sectional view of the device substrate 4 in the manufacturing process, and a partial sectional view of the device substrate 4 taken along the line II-II in FIG. 1. For example, the support substrate 20 is formed of a material such as glass and quartz. A resin film made of polyimide, for example, is laminated on the support substrate 20 as a base material 22 of the device substrate 4. A circuit layer 24 and an OLED layer 26 are formed on the base material 22, and a sealing film 28 is formed on the OLED layer 26.

A pixel circuit formed of elements such as the TFT described above, a scan signal line, a video signal line, and a drive power source line are formed on the circuit layer 24.

The OLED layer 26 includes a pixel electrode 30, an organic EL function layer 32, a counter electrode 34, and a bank 36.

The OLED is comprised of the pixel electrode 30, the counter electrode 34, and the organic EL function layer 32 therebetween. Basically, the counter electrode 34 is a common electrode in contact with the organic EL function layer 32 of all pixels of the display area. The pixel electrode 30 is formed separately for each of the pixels. In this embodiment, the counter electrode 34 forms a cathode of the OLED, and the pixel electrode 30 forms an anode.

The sealing film 28 has a function to protect the OLED from moisture ingress, for example.

Figure 3:
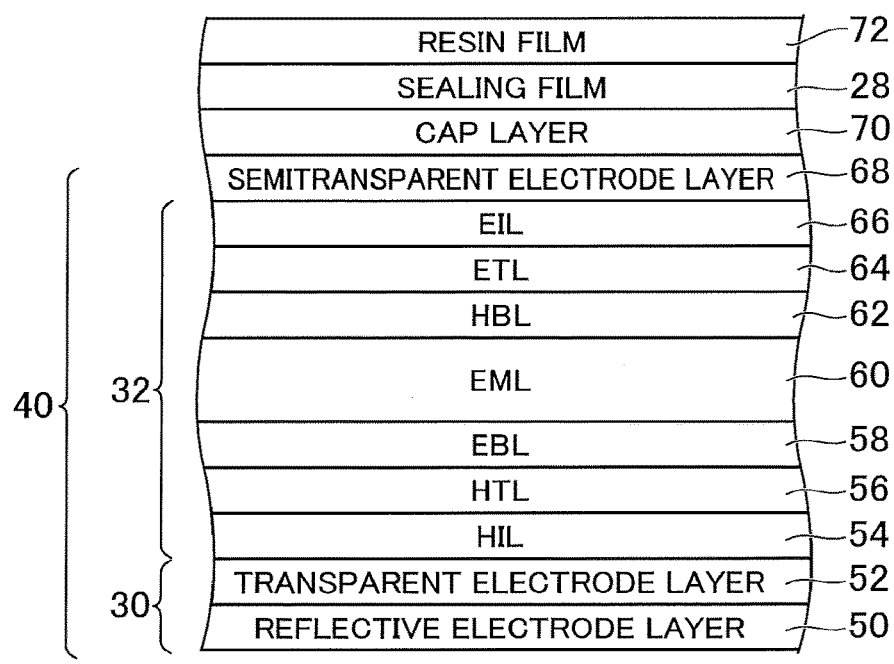
FIG. 3 is a schematic vertical sectional view of the device substrate above the OLED layer.

FIG. 3 is a schematic vertical sectional view of the device substrate 4 above the OLED layer 26, and shows the sectional view taken along the line in FIG. 2.

Basically, the laminate structure of the pixel electrode 30, the organic EL function layer 32, and the counter electrode 34 shown in FIG. 2 form an OLED 40. As shown in FIG. 2, the laminate structure of the OLED 40 includes the pixel electrode 30, the organic EL function layer 32, and the counter electrode 34, which are laminated from the base material 22 side in this order. FIG. 3 illustrates the laminate structure of the OLED 40 in more detail.

In this embodiment, the OLED 40 is a top-emission OLED, and emits light generated in the organic EL function layer 32 upward in FIGS. 2 and 3. The pixel electrode 30 is an anode. The pixel electrode 30 correspondingly has a structure in which a transparent electrode layer 52 is laminated on a reflective electrode layer 50. The reflective electrode layer 50 is formed of a highly light reflective material, such as aluminum (Al) and silver (Ag), and reflects light from the organic light-emitting layer of the organic EL function layer 32 to a display surface, that is, to the counter electrode 34 side, by the reflective electrode layer 50. Further, the transparent electrode layer 52 is formed of transparent conductive material, such as indium tin oxide (ITO) and indium zinc oxide (IZO). These transparent conductive materials have a large work function, and thus can efficiently inject holes into the organic EL function layer 32.

The counter electrode 34, which is a cathode, includes a semitransparent electrode layer 68 as a layer in contact with the organic EL function layer 32. The semitransparent electrode layer 68 is a thin film made of metal having a low work function, such as MgAg alloy, so that electrons are efficiently injected into the organic EL function layer 32.

The holes and the electrons that are injected from the pixel electrode 30 and the counter electrode 34, respectively, recombine in an organic emissive layer (EML) 60 of the organic EL function layer 32 and generate exciton, which leads to light emission.

The organic EL function layer 32 has an auxiliary layer that efficiently injects a carrier into the EML 60 when a voltage is applied to the OLED 40. Specifically, a hole injection layer (HIL) 54 laminated on the transparent electrode layer 52 is provided between the anode and the EML 60. A hole transport layer (HTL) 56 is laminated on the surface of the HIL 54. Further, an electron blocking layer (EBL) 58 may be inserted between the HTL 56 and the EML 60. An electron injection layer (EIL) 66, an electron transport layer (ETL) 64, and a hole blocking layer (HBL) 62 may be provided between the cathode and the EML 60 in this order from the semitransparent electrode layer 68 side forming the counter electrode 34 toward the EML 60 side.

A cap layer 70 is laminated on the surface of the semitransparent electrode layer 68, and the sealing film 28 is laminated on the surface of the cap layer 70. A resin film 72 is formed on the sealing film 28.

The cap layer 70 has outcoupling function for improving light extraction efficiency from the OLED 40. As described above, the sealing film 28 protects the OLED 40 from moisture ingress. The resin film 72 provides mechanical strength of the surface of the display area of the device substrate 4, and protects the laminate structure below the device substrate 4.

Here, as described above, there is a problem in the prior art that unintended delamination occurs in the laminate structure of the OLED in the process of removing the device substrate 4 formed on the support substrate 20 from the support substrate 20. In particular, unlike a lighting unit, even minute delamination in the display device could be a non-light emitting pixel and lower image quality. Positions where the unintended delamination likely occurs include firstly the interface between the anode and the HIL, and secondly the interface between the EIL and the cathode. The present invention is directed to solving this problem, and the features of the present invention will be described below.

One of the features of the present invention is, in the process of removing the device substrate 4 from the support substrate 20, preparing, in a layer of the device substrate 4 other than the OLED, a point where delamination likely occurs (hereinafter referred to as "delamination inducing point") compared to a point in the laminate structure of the OLED. In the process of removing the support substrate 20, delamination is generated at the delamination inducing point, and thus delamination can be prevented from occurring in the laminate structure of the OLED 40.

Figure 4:
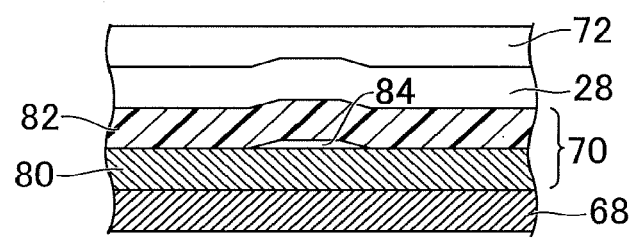
FIG. 4 is a part of a schematic vertical sectional view of a structure of a delamination inducing point.

FIG. 4 is a schematic vertical sectional view of the structure of the delamination inducing point in the vertical sectional view shown in FIG. 3. A transparent electrode layer 80 and an organic film 82 are sequentially laminated as the cap layer 70 on the surface of the semitransparent electrode layer 68 forming the counter electrode 34, and the sealing film 28 is laminated on the surface of the organic film 82. The interface between the transparent electrode layer 80 and the organic film 82 is the delamination inducing point, and the device substrate 4 removed from the support substrate 20 includes, in at least a part of the display area 6, a gap 84 between the transparent electrode layer 80 and the organic film 82. The gap 84 is a hollow generated due to the delamination at the interface between the transparent electrode layer 80 and the organic film 82.

The transparent electrode layer 80 is formed of metal-oxide conductive material, such as ITO and IZO. As described above, the cap layer 70 is outcoupling means of light emitted from the OLED 40, and needs to have a high refractive index compared to the semitransparent electrode layer 68. The transparent electrode layer 80 laminated on the semitransparent electrode layer 68 made of MgAg alloy is formed of ITO or IZO, for example, and satisfies the requirement for the cap layer 70. The transparent electrode layer 80 also functions as the counter electrode 34 together with the semitransparent electrode layer 68, and helps to reduce resistance of the counter electrode 34.

The organic film 82 may be formed of a hole injection layer material that satisfies the condition where energy E of lowest unoccupied molecular orbital (LUMO) is $-5.5$ electron volt$\leq E \leq -4.5$ electron volt. The hole injection layer material used for the organic film 82 is preferred to contain a fluoro group. For example, the organic film 82 is formed of hexaazatriphenylene hexacarbonitrile (HAT-CN).

The configuration of the cap layer 70 composed of the transparent electrode layer 80 and the organic film 82 simulates the conventional interface between the anode and the HIL, which is easily delaminated. That is, in the conventional configuration having the problem of delamination, the transparent electrode layer of the anode is formed of ITO or IZO and the HIL is formed of, for example, an organic material, which is HAT-CN. In the present invention, the transparent electrode layer 80 formed of transparent conductive material, such as ITO, is disposed at the delamination inducing point as in the anode, and the organic film 82 laminated on the transparent electrode layer 80 is formed of the same material as the conventional HIL. This configuration facilitates delamination at the interface between the transparent electrode layer 80 and the organic film 82.

Further, the material of the HIL 54 is different from the material of the conventional HIL used for the organic film 82, and thus the interface between the transparent electrode layer 52 and the HIL 54 is formed in a way to be delaminated less easily than the interface between the transparent electrode layer 80 and the organic film 82, that is, the delamination inducing point. More specifically, the HIL 54 is formed of a sputter carbon film or a mixture of positive hole transport material and dopant, and adhesion between the transparent electrode layer 52 and the HIL 54 is thus improved. The amine hole transport material is suitable for the hole transport material used for the HIL 54.

If there is no delamination inducing point, since the interface between the transparent electrode layer 52 and the HIL 54 is formed so that delamination is hard to occur, the probability of delamination to occur at the interface between the semitransparent electrode layer 68 and the EIL 66, where delamination second likely occur, gets increased. This is prevented, however, by providing the delamination inducing point in the present invention.

The present invention is not limited to the above described embodiments and may be modified in various manners. For example, the configuration described in the embodiment may be replaced by any configurations that have substantially the same configuration as the configuration in the embodiment described above, provide the same effects as those of the embodiment described above, or achieve the same objective as that of the embodiment described above.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
   a flexible base material;
   a plurality of organic electroluminescence elements, each comprising a pixel electrode, a reflective layer that is disposed between the base material and the pixel electrode and reflects light, a semitransparent counter electrode that is disposed on a light-emitting surface side with respect to the pixel electrode and opposes to the pixel electrode, and an organic electroluminescence function layer that is a lamination including an organic light-emitting layer and disposed between the pixel electrode and the counter electrode;
   a transparent electrode laminated on the counter electrode;
   an organic film laminated on the transparent electrode; and
   a gap generated at a part of an interface between the transparent electrode and the organic film.

2. The organic electroluminescence display device according to claim 1, wherein
   the transparent electrode is formed of a metal-oxide conductive material, and
   the organic film is formed of a hole injection layer material that satisfies a condition where an energy E of a lowest unoccupied molecular orbital is $-5.5$ electron volt$\leq E \leq -4.5$ electron volt.

3. The organic electroluminescence display device according to claim 2, wherein
   the transparent electrode is formed of indium tin oxide or indium zinc oxide.

4. The organic electroluminescence display device according to claim 2, wherein
   the organic film is formed of a material having a fluoro group.

5. The organic electroluminescence display device according to claim 1, wherein
   the organic electroluminescence function layer includes a layer as a hole injection layer laminated on the pixel electrode, the layer being formed of a sputter carbon film or a mixture of a positive hole transport material and dopant.

6. The organic electroluminescence display device according to claim 5, wherein
   the positive hole transport material is an amine hole transport material.

* * * * *